United States Patent
Ahn et al.

(10) Patent No.: US 8,194,438 B2
(45) Date of Patent: Jun. 5, 2012

(54) NVSRAM HAVING VARIABLE MAGNETIC RESISTORS

(75) Inventors: Yongchul Ahn, Eagan, MN (US); Antoine Khoueir, Apple Valley, MN (US); Yong Lu, Rosemount, MN (US); Hongyue Liu, Maple Grove, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 156 days.

(21) Appl. No.: 12/370,164

(22) Filed: Feb. 12, 2009

(65) Prior Publication Data

US 2010/0202191 A1 Aug. 12, 2010

(51) Int. Cl.
*G11C 11/00* (2006.01)

(52) U.S. Cl. .................. 365/158; 365/154; 365/185.08; 365/171

(58) Field of Classification Search .................. 365/154, 365/156, 185.08, 148, 158, 163, 171, 173
See application file for complete search history.

(56) References Cited

U.S. PATENT DOCUMENTS

| | | | |
|---|---|---|---|
| 5,488,579 A | 1/1996 | Sharma et al. | |
| 5,680,363 A | 10/1997 | Dosaka et al. | |
| 6,097,629 A | 8/2000 | Dietrich et al. | |
| 6,414,873 B1 | 7/2002 | Herdt | |
| 6,714,444 B2 * | 3/2004 | Huai et al. | 365/171 |
| 7,082,053 B1 * | 7/2006 | Jenne et al. | 365/173 |
| 7,164,608 B2 | 1/2007 | Lee | |
| 7,173,841 B2 * | 2/2007 | Peng et al. | 365/66 |
| 7,206,217 B2 * | 4/2007 | Ohtsuka et al. | 365/154 |
| 7,280,397 B2 | 10/2007 | Scheuerlein | |
| 7,379,327 B2 * | 5/2008 | Chen et al. | 365/158 |
| 7,599,210 B2 * | 10/2009 | Okazaki et al. | 365/148 |
| 7,692,954 B2 * | 4/2010 | Lamorey | 365/154 |
| 7,791,941 B2 * | 9/2010 | Hanafi | 365/185.08 |
| 7,903,451 B2 * | 3/2011 | Yamada et al. | 365/154 |
| 2008/0151624 A1 | 6/2008 | Still | |
| 2012/0020159 A1 * | 1/2012 | Ong | 365/185.08 |

OTHER PUBLICATIONS

Zhao et al., "Integration of Spin-RAM technology in FPGA Circuits" Solid-State and Integrated Circuit Technology, 2006. ICSICT '06. 8th International Conference on, Originally published: Oct. 23-26, 2006, Version Presented Apr. 23, 2007, pp. 799-802, Digital Object Identifier: 10.1109/ICSICT.2006.306511.*

* cited by examiner

*Primary Examiner* — Tuan T Nguyen
*Assistant Examiner* — Lance Reidlinger
(74) *Attorney, Agent, or Firm* — Mueting Raash & Gebhardt PA

(57) ABSTRACT

Non-volatile static random access memory (nvSRAM) that has a six transistor static random access memory (6T SRAM) cell electrically connected to a non-volatile random access memory (nvRAM) cell. The nvRAM cell has first and second variable magnetic resistors and first, second and third transistors.

7 Claims, 4 Drawing Sheets

NVSRAM HAVING VARIABLE MAGNETIC RESISTORS

BACKGROUND

Semiconductor memory devices are widely used in the computer and electronics industries to store digital information. A typical semiconductor memory device has a large number of memory elements, known as memory cells, that are each capable of storing a single digital bit or data bit. Some memory cells store critical process data in numerical controls such as diagnostic and measurement systems and industrial and automotive electronics.

Static random access memory (SRAM) is well known in the art and consists of a bistable transistor flip-flop or latching circuit. The data retained in the SRAM cell is volatile, in that any interruption of the power supply voltage source causes loss of the data. An alternate to the volatile SRAM is non-volatile RAM (nvRAM). Non-volatile RAM consists of a floating gate transistor which has a charge placed on a floating gate to modify the voltage threshold of the floating gate transistor that indicates the state of the data retained in the nvRAM. Stored data is not lost upon interruption of power.

Non-volatile static random access memory (nvSRAM) is the product of non-volatile data retention as well as fast SRAM operation. An nvSRAM has two different modes of operation: SRAM mode and non-volatile mode. An nvSRAM takes advantages of fast data read/write operations (a benefit of the SRAM portion) and it is a solution where reliable data retention has to be guaranteed under extreme conditions (a benefit of the nvRAM portion). Although there are benefits of nvSRAM, there are also deficiencies.

One typical nvSRAM cell consists of a six transistor SRAM cell, commonly referred to as a 6T SRAM cell, and a six transistor electrically erasable programmable read-only memory, commonly referred to as a six transistor EEPROM or 6T EEPROM. In the 6T EEPROM, two of the six transistors are non-volatile transistors used for SRAM data store operations. The key operation of this product is normal SRAM operation, including bulk erase of non-volatile memory for data reset, programming non-volatile memory to store data from SRAM and data recall process from non-volatile memory to SRAM. However, as the technology aggressively scales down metal oxide semiconductor field effect transistors, (MOSFETs), the leakage currents of MOSFETs are increasing, which causes a high stand-by current as well as the degradation of data retention of the EEPROM. This also limits a scaling down of chip integrity of the current nvSRAM products. There are always needs for improvements in memory architecture.

BRIEF SUMMARY

The present disclosure relates to non-volatile static random access memory (nvSRAM) cells that include a static random access memory (SRAM) cell and a non-volatile random access memory (nvRAM) cell. The nvSRAM cell includes variable magnetic resistors as the non-volatile memory device connected to the SRAM cell. Methods for storing and retrieving data from the nvSRAM are also disclosed.

In one particular embodiment, the disclosure provides a non-volatile static random access memory (nvSRAM) that has a six transistor static random access memory (6T SRAM) cell, and a non-volatile random access memory (nvRAM) cell having first and second variable magnetic resistors and first, second and third transistors, the SRAM cell being electrically connected to the nvRAM cell.

In another particular embodiment, the disclosure provides a non-volatile static random access memory (nvSRAM) that has a six transistor static random access memory (6T SRAM) cell, and a non-volatile random access memory (nvRAM) cell that has a first stack and a second stack connected in parallel to the 6T SRAM cell. A transistor is connected in series to each of the first stack and the second stack, the stacks being positioned electrically between the 6T SRAM cell and the third transistor.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
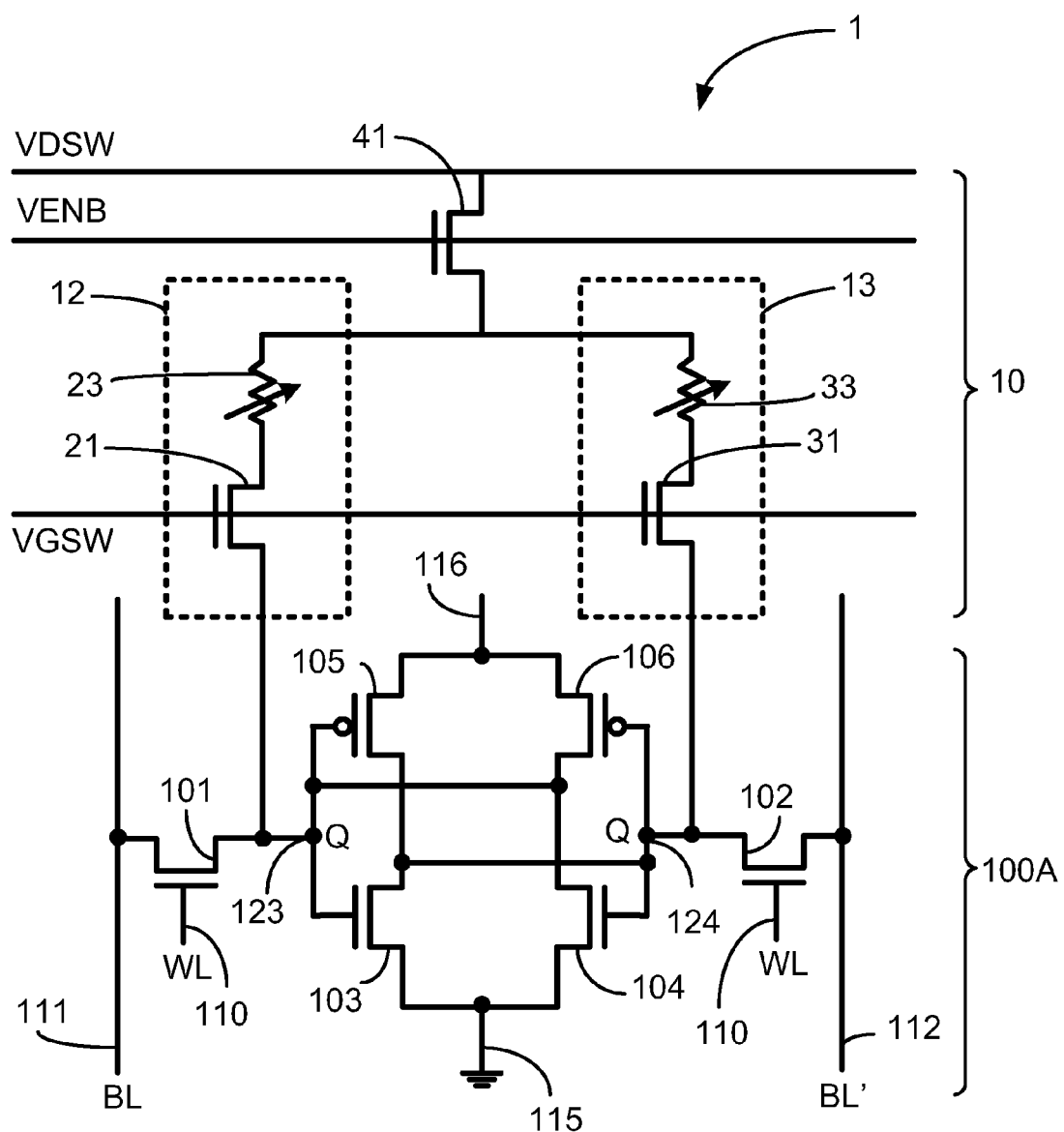
FIG. 1A is a schematic diagram of a non-volatile static random access memory of the present invention.

The present invention is directed to memory, more particularly, to a static random access memory (SRAM) cell coupled to a non-volatile random access memory (nvRAM) cell. The resulting non-volatile static random access memory (nvSRAM) utilizes the nvRAM cell for data storage and recall upon power failure in the SRAM cell.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to a non-volatile static random access memory (nvSRAM) that utilizes non-volatile data retention as well as fast SRAM operation. The nvSRAM has two different modes of operation: SRAM mode and non-volatile mode. The nvSRAM takes advantages of fast data read/write operations and it is a solution where reliable data retention has to be guaranteed under extreme conditions. The nvSRAM also reduces the number of integrated circuits and increases the flexibility and power of the system.

The nvSRAM cell of this invention utilizes variable magnetic resistors as a non-volatile memory device connected with six transistor static random access memory (6T SRAM) cell. It also includes three transistors to operate the nvSRAM function. One transistor is coupled with each variable magnetic resistor to provide a stack. The two stacks are connected in parallel between the 6T SRAM and the third transistor.

The operation of the nvSRAM cell for data storage and recall is implemented by the variable magnetic switching resistors. Since the non-volatile memory portion is employed with magnetic resistive switching or spin-torque magnetic resistor devices, the nvSRAM cell has the more flexible chip integrity of non-volatile memories over SRAMs. The nvSRAM cell of this invention also provides small operating voltages of non-volatile memory and fast data processing such as SRAM read/write operation and data store/recall. Further, the design does not require the previously required data reset step prior to storing new data in the nvSRAM, since the resistance of the variable magnetic switching resistors will vary based on current direction, which is controlled by the SRAM.

While the present disclosure is not so limited, an appreciation of various aspects of the disclosure will be gained through a discussion of the examples provided below.

In FIG. 1A is illustrated a schematic diagram or a circuit diagram of the non-volatile static random access memory (nvSRAM) cell of this invention. nvSRAM cell 1 has a volatile portion 100A and a non-volatile portion 10. Volatile portion 100A is a SRAM cell, particularly, a six transistor SRAM cell, commonly referred to as a 6T SRAM cell. 6T SRAM cell 100A of FIG. 1A is briefly discussed below.

The non-volatile portion, nvRAM 10, has a first stack 12 and a second stack 13. First stack 12 has a first transistor 21 and a first variable magnetic resistor 23. Similarly, second stack 13 has a second transistor 31 and a second variable magnetic resistor 33. nvRAM 10 also has a third transistor 41. In some embodiments, the resistances across transistor 21 and transistor 31 are approximately equal. Stacks 12, 13 are electrically and operationally connected in parallel to third transistor 41. At their other end, stacks 12, 13 are electrically and operationally connected to 6T SRAM 100A. Stacks 12, 13 are oriented so that variable magnetic resistors 23, 33 are electrically positioned between third transistor 41 and transistors 21, 31.

Variable magnetic resistors 23, 33 may alternately be referred to as spin-torque magnetic resistors or magnetic tunnel junctions. One type of conventional variable magnetic resistor is a spin valve, which includes an antiferromagnetic layer, a ferromagnetic pinned layer, a ferromagnetic free layer, and a nonmagnetic yet conductive spacer layer between the pinned layer and the free layer. The antiferromagnetic layer is used to fix, or pin, the magnetization orientation of the pinned layer in a particular direction. The magnetization orientation of the free layer is free to rotate, typically in response to an external field. Another conventional variable magnetic resistor is a magnetic tunneling junction or spin tunneling junction. Portions of the spin tunneling junction are analogous to the spin valve. The tunnel junction has an antiferromagnetic layer, a pinned layer, an insulating barrier layer and a free layer. The barrier layer is sufficiently thin to allow electrons to tunnel therethrough. For both spin valve and a magnetic tunneling junction elements, the resistance of the element changes depending upon the orientations of the magnetizations of the free layer and the pinned layer. When the magnetizations of the free layer and pinned layer are parallel, the resistance of the magnetic element is low, $R_L$. When the magnetizations of the free layer and the pinned layer are antiparallel, the resistance is high, $R_H$. It is preferred that the resistance differential in the variable magnetic resistors is large (i.e., $R_H \gg R_L$). In general, when current passes from the pinned layer to the free layer, the magnetization orientations are antiparallel, and when current passes from the free layer to the pinned layer, the magnetization orientations are parallel.

Returning to FIG. 1A, nvRAM 10 has three voltage sources. A first voltage source, identified as VGSW in FIG. 1A, is electrically connected to first and second transistors 21, 31 to enable transistors 21, 31. A second voltage source, identified as VENB in FIG. 1A, is electrically connected to third transistor 41 to enable transistor 41. A third voltage source, identified as VDSW, is connected to third transistor 41 at its source/drain terminal, opposite the connection to stacks 12, 13. Stacks 12, 13 are connected to SRAM cell 100A.

SRAM cell 100A is a six transistor SRAM cell, commonly referred to as a 6T SRAM cell. 6T SRAM cell 100A has six transistors, 101, 102, 103, 104, 105 and 106. Transistors 101, 102 are commonly referred to as access transistors, and have equal resistance values. Transistors 103, 104 are n-type transistors and transistors 105, 106 are p-type transistors. SRAM cell 100A is electrically connected to a word line WL 110 to enable transistors 101, 102, first and second bit lines BL 111 and BL' 112, a voltage ground 115, and a voltage drain or source 116. A first bit of data can be stored at node Q 123 and a second bit of data can be stored at node Q 124. Access to 6T SRAM cell 100A is enabled by word line WL 110, which controls access transistors 101, 102, which in turn controls whether cell 100A is electrically connected to bit line BL 111 and BL' 112, respectively. Access transistor 101 has a first source/drain terminal connected to storage node Q 123 that is formed by the junction of n-type resistor 103 and p-type resistor 105, and a second source/drain terminal connected to the bit line BL 111. Access transistor 102 has a first source/drain terminal connected to storage node Q 124 that is formed by the junction of n-type resistor 104 and p-type resistor 106, and a second source/drain terminal connected to the bit line BL' 112. Access transistors 101, 102 transfer data for both read and write operations.

Figure 1B:
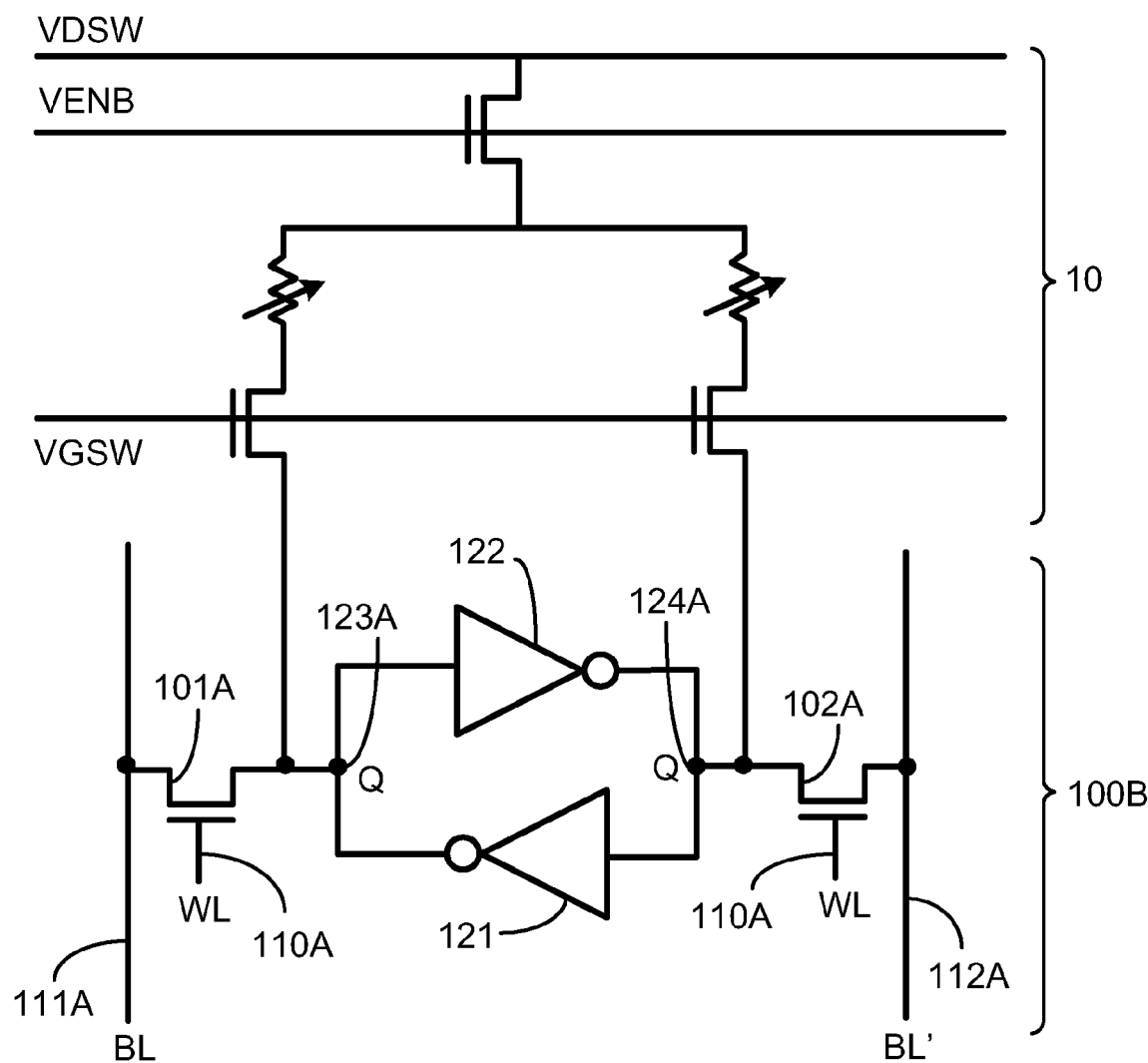
FIG. 1B is an alternate schematic diagram of the non-volatile static random access memory of the present invention.

An alternate schematic representation of the memory cell of the present invention is illustrated in FIG. 1B. SRAM cell 100B is a six transistor SRAM cell and can be one conventionally known. In this diagram, SRAM cell 100B has a first inverter 121 and a second inverter 122 coupled such that the output of first inverter 121 is connected to the input of second inverter 122 and the output of second inverter 122 is connected to the input of first inverter 121, to form a bistable latch. First and second inverters 121, 122 each consist of an n-type metal oxide semiconductor (MOS) transistor and a p-type MOS transistor configured as the well known complementary metal oxide semiconductor (CMOS) inverter. A first access transistor 101A has a first source/drain terminal connected to a storage node Q 123A that is formed by the junction of the input of first inverter 121 and the output of second inverter 122 and a second source/drain terminal connected to the bit line BL 111A. A second access transistor 102A has a first source/drain terminal connected to the complementary storage node Q 124A that is formed by the input of second inverter 122 and the output of first inverter 121 and a second source/drain terminal connected to the bit line BL' 112A. The gates of the first and second access transistors 101A, 102A are connected to word line WL 110A to receive the activation signals for enabling SRAM cell 100B.

The gates of the n-type MOS transistor and the p-type MOS transistor of first inverter 121 are connected to a common drain connection of the n-type MOS transistor and the p-type MOS transistor of second inverter 122, and the gates of the n-type MOS transistor and the p-type MOS transistor of second inverter 122 are connected to the common drain connection of the n-type MOS transistor and the p-type MOS transistor of first inverter 121. This forms the cross-connection to create the bistable flip-flop with the common drain connection of the n-type MOS transistor and the p-type MOS transistor of second inverter 122 whose output being the storage node Q 124A and the common drain connection of the n-type MOS transistor and the p-type MOS transistor of first inverter 121 whose output being the storage node Q 123A.

Electrically connected to either SRAM 100A or SRAM 100B, between access transistors 101, 101A and 102, 102A and storage node Q 123, 123A and storage node Q 124, 124A, respectively, is nvRAM 10 according to the present invention. As described above, nvRAM 10 has two parallel stacks, each having a transistor and a variable magnetic resistor, connected to a third transistor. nvRAM cell 10 provides data storage and recall upon power failure in SRAM 101A, 100B. The operation of the nvSRAM cell of this invention depends on the variable magnetic switching resistors, or spin-torque magnetic resistor devices, as their resistance varies based on current direction, which is controlled by the output from the CMOS latch of the SRAM.

nvRAM 10 having the three transistors and two variable magnetic resistors provides non-volatile memory that is improved over conventional EEPROM non-volatile memories, at least because it occupies less chip area, is more flexible in its configuration, is less expensive to manufacture, and has a much faster operational speed (e.g., about 1 ns) compared to EEPROM non-volatile memory with transistors (e.g., about 10 ns). Additionally, non-volatile memory of this invention, nvRAM 10, operates at low power and at low voltage, similar to the voltage of SRAM 100A or SRAM 100B, as compared to an EEPROM non-volatile memory that operates at high voltage.

Figure 2:
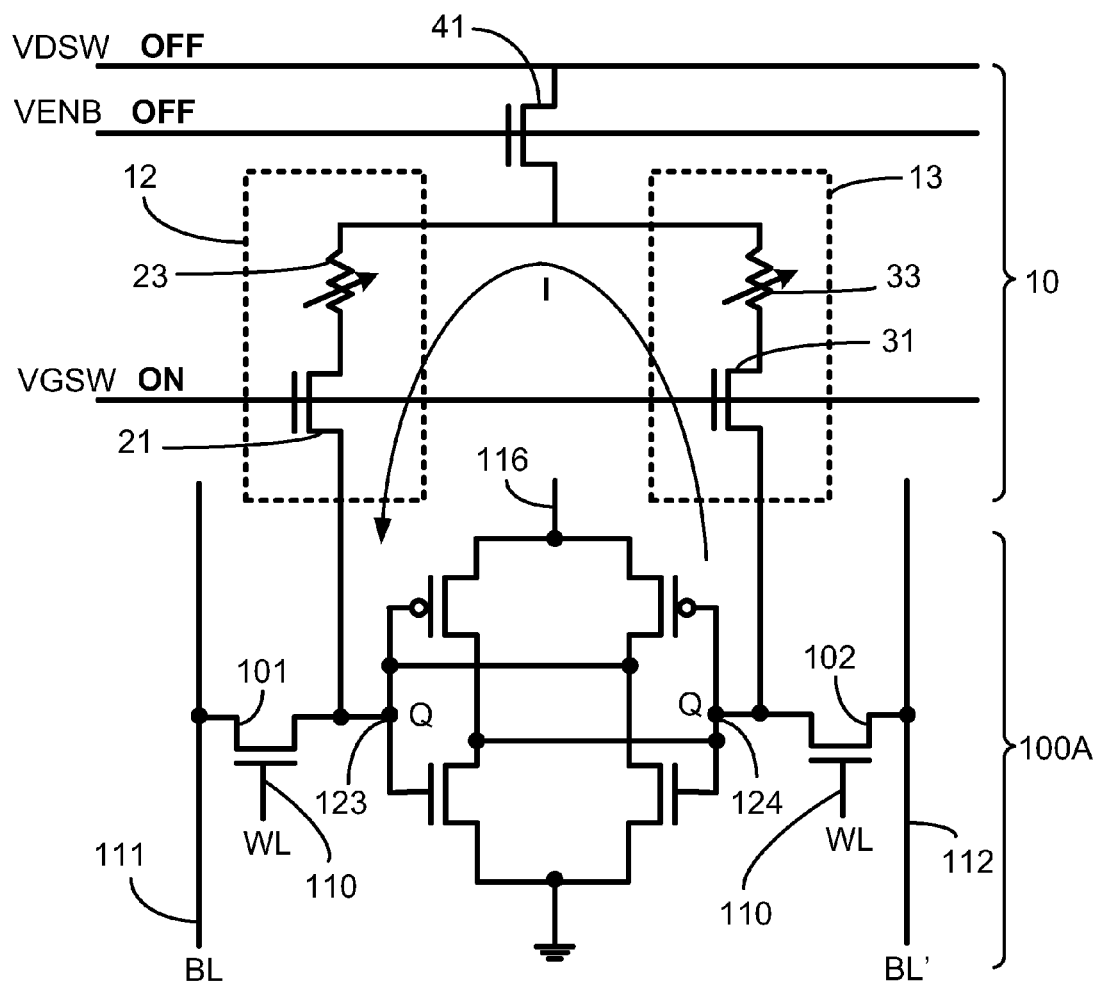
FIG. 2 is a schematic diagram of the non-volatile static random access memory of the present invention in data storage cycle.

FIG. 2 illustrates a general sequence for storing data from SRAM 100A to nvRAM 10. To store data from SRAM 100A, third transistor 41 is disabled, by having voltage sources VENB and VDSW both off, and transistors 21, 31 in stacks 12, 13 are enabled by having voltage sources VGSW on. Additionally, in SRAM 100A, word line WL 110 and bit lines BL 111, BL' 112 are off and voltage drain/source 116 is on. This creates a closed loop from SRAM 100A through nvRAM 10 and stacks 12, 13.

When node Q 123 has a data bit "0" and node Q 124 has a data bit "1", current flows from node Q124 and node Q 123, passing through nvRAM 10 from second stack 13 to first stack 12. The data bits are stored in variable resistors 23, 33. In one configuration, variable resistor 23 of first stack 12 is designed to have the magnetization orientations in antiparallel configuration due to the illustrated current direction, and thus have a high resistance value $R_H$. Variable resistor 33 of second stack 13 is designed to have the magnetization orientations in parallel configuration due to the illustrated current direction, and to switch to a low resistance value $R_L$. These resistance levels store the data bit.

If node Q 123 has a data bit "1" and node Q 124 has a data bit "0", the current flows in the opposite direction, passing through nvRAM 10 from first stack 12 to second stack 13. With the variable resistor configuration of above, variable resistor 23 of first stack 12 will switch to a low resistance value $R_L$ and variable resistor 33 of second stack 13 will switch to a high resistance value $R_H$.

There is no need to reset the data prior to storing subsequent data, since variable resistors 23, 33 will change their data state, if necessary, upon passage of another storage current through resistors 23, 33 from SRAM 100A. It is preferred that nvRAM 10 is designed so that the resistance differential in the variable magnetic resistors is large (i.e., $R_H \gg R_L$) and that $R_H$ is greater than the resistance of any of the transistors ($R_N$; i.e., transistors 21, 31, 101, etc.) so that nvRAM 10 can restore data in SRAM cell 100A from resistors 23, 33 without loosing the previous states contained in SRAM cell 100A before the power is turned off.

Figure 3:
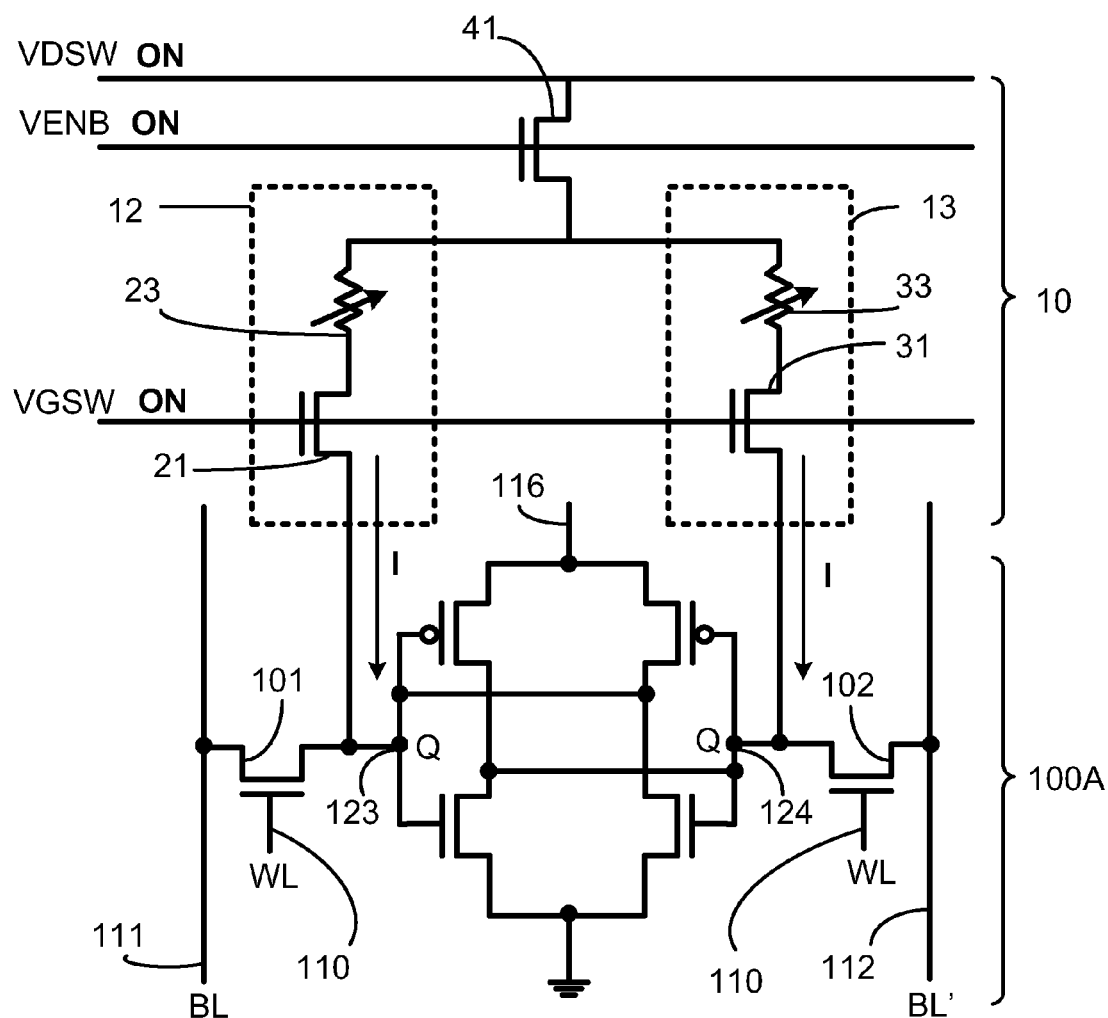
FIG. 3 is a schematic diagram of the non-volatile static random access memory of the present invention in data recall cycle.

FIG. 3 illustrates a general sequence for retrieving or recalling data from nvRAM 10 to SRAM 100A. To recall data from SRAM 100A, third transistor 41 is enabled, by having voltage sources VENB and VDSW both on, and transistors 21, 31 in stacks 12, 13 are enabled by having voltage source VGSW on. Additionally, in SRAM 100A, word line WL 110 is on, and bit lines BL 111, BL' 112 and voltage drain/source 116 are grounded. The resulting flow of current is from voltage source VDSW, through transistor 41, then parallel through stack 12 to node Q 123 and access transistor 101 to bit line BL 111 and through stack 13 to node Q 124 and access transistor 102 to bit line BL' 112. The voltage at node Q 123 and node Q124 will be directly related to the resistance of variable magnetic resistors 23, 33 (i.e., $R_H$ or $R_L$), and will provide the data bit to bit line BL 111 and bit line BL' 112, respectively. Specifically, the voltage at node Q 123 will be:

$$V_{123} = V_{41} * R_{101}/(R_H + R_{21} + R_{101})$$

and the voltage at node Q 124 will be $$V_{124} = V_{41} * R_{102}/(R_L + R_{31} + R_{102})$$

Wherein $V_{41}$ is the voltage at third transistor 41, $R_{21}$ and $R_{31}$ are the resistance across the transistors 21, 31, respectively, and $R_{101}$ and $R_{102}$ are the resistance across access transistors 101, 102, respectively.

After the data is retrieved and stored at the output nodes Q 123, Q 124 of SRAM 100A, voltage sources VGSW, VENB and VDSW are turned off, as is word line WL 110. The CMOS latch of SRAM 100A is enabled by turning on source/drain 116.

The previous discussion provides a summary of the operation of the non-volatile static random access memory of this invention, which combines a non-volatile memory having three transistors and two variable magnetic resistors with a 6T SRAM cell.

Thus, embodiments of the nvSRAM HAVING VARIABLE MAGNETIC RESISTORS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

The use of numerical identifiers, such as "first", "second", "third", etc. in the claims that follow is for purposes of identification and providing antecedent basis. Unless content clearly dictates otherwise, it should not be implied that a numerical identifier refers to the number of such elements required to be present in a device, system or apparatus. The numerical identification is for element differentiation. For example, if a device includes a first transistor, it should not be implied that a second transistor is required in that device. Similarly, if a device includes a third transistor, it should not be implied that a first transistor and a second transistor are required in that device.

What is claimed is:

1. A non-volatile static random access memory (nvSRAM) comprising:
    a six transistor static random access memory (6T SRAM) cell; and
    a non-volatile random access memory (nvRAM) cell comprising a first stack and a second stack in parallel, the first stack comprising a first variable magnetic resistor and a first transistor, the second stack comprising a second variable magnetic resistor and a second transistor, the first stack and the second stack each in series with a third transistor
    the 6T SRAM cell electrically connected to the nvRAM cell, wherein the first and second variable magnetic resistors are spin-torque magnetic tunnel junctions comprising a free layer, a pinned layer, and a tunneling layer therebetween.

2. The nvSRAM of claim 1 wherein the first stack and the second stack are each electrically connected between the SRAM cell and the third transistor.

3. The nvSRAM of claim 1 wherein the first and second transistors are electrically connected to a first voltage source to enable the first and second transistors, the third transistor is connected to a second voltage source to enable the third transistor, and the third transistor has a source/drain terminal that is electrically connected to a third voltage source.

4. The nvSRAM of claim 1 wherein the first and second stacks are arranged with the first and second variable magnetic resistors electrically between the first and second transistors, respectively, and the third transistor.

5. A non-volatile static random access memory (nvSRAM) comprising:
    a six transistor static random access memory (6T SRAM) cell; and
    a non-volatile random access memory (nvRAM) cell comprising a first stack and a second stack connected in parallel to the 6T SRAM cell, and a third transistor connected in series to each of the first stack and the second stack, the stacks positioned electrically between the 6T SRAM cell and the third transistor, wherein the first stack comprises a spin-torque magnetic tunnel junction comprising a free layer, a pinned layer, and a tunneling layer therebetween and a first transistor, and the second stack comprises a spin-torque magnetic tunnel junction comprising a free layer, a pinned layer, and a tunneling layer therebetween and a second transistor.

6. The nvSRAM of claim 5 wherein:
    the first transistor and the second transistor are electrically connected to a first voltage source to enable the first and second transistors,
    the third transistor is connected to a second voltage source to enable the third transistor, and
    the third transistor has a source/drain terminal that is electrically connected to a third voltage source.

7. The nvSRAM of claim 5 wherein the first and second stacks are arranged with the first and second variable magnetic resistors electrically between the first and second transistors, respectively, and the third transistor.

* * * * *